United States Patent
Iwai et al.

(10) Patent No.: US 9,647,648 B2
(45) Date of Patent: May 9, 2017

(54) SIGNAL PROCESSOR

(71) Applicant: FUJITSU TEN LIMITED, Kobe-shi, Hyogo (JP)

(72) Inventors: Kenta Iwai, Kobe (JP); Daisuke Enomoto, Kobe (JP); Kazuhiro Komatsu, Kobe (JP)

(73) Assignee: FUJITSU TEN LIMITED, Kobe-shi (JP)

( * ) Notice: Subject to any disclaimer, the term of this patent is extended or adjusted under 35 U.S.C. 154(b) by 363 days.

(21) Appl. No.: 14/602,508

(22) Filed: Jan. 22, 2015

(65) Prior Publication Data

US 2015/0229301 A1 Aug. 13, 2015

(30) Foreign Application Priority Data

Feb. 12, 2014 (JP) ................. 2014-023955

(51) Int. Cl.
  *G01S 13/02* (2006.01)
  *H03K 5/1252* (2006.01)
  *G01S 7/40* (2006.01)
  *G01S 7/35* (2006.01)
  *G01S 13/93* (2006.01)

(52) U.S. Cl.
  CPC ............ *H03K 5/1252* (2013.01); *G01S 7/354* (2013.01); *G01S 7/4021* (2013.01); *G01S 13/02* (2013.01); *G01S 13/931* (2013.01); *G01S 2007/356* (2013.01)

(58) Field of Classification Search
  CPC .. G01S 13/02; G01S 13/931; G01S 2007/356; G01S 7/354; G01S 7/4021
  USPC .................................................... 342/175
  See application file for complete search history.

(56) References Cited

U.S. PATENT DOCUMENTS

| 4,190,882 | A | 2/1980 | Chevalier et al. |
| 5,311,190 | A * | 5/1994 | Devendorf ............ G01S 7/032 342/103 |
| 7,456,781 | B2 | 11/2008 | Honda |
| 2005/0088336 | A1 | 4/2005 | Sakamoto et al. |
| 2012/0038498 | A1 * | 2/2012 | Oshima ............... H03M 1/1033 341/110 |

FOREIGN PATENT DOCUMENTS

| JP | A-4-244734 | 9/1992 |
| JP | A-2011-099676 | 5/2011 |

OTHER PUBLICATIONS

Apr. 11, 2016 Office Action issued in German Patent Application No. 10 2015 100 431.3.
Sep. 9, 2014 Office Action issued in Japanese Application No. 2014-126760 (with translation).

* cited by examiner

*Primary Examiner* — Timothy A Brainard
(74) *Attorney, Agent, or Firm* — Oliff PLC

(57) ABSTRACT

A signal processor includes an amplifier that amplifies a control signal which is input into the amplifier to output an amplified control signal; and a controller that performs predetermined control based on the amplified control signal. When the control signal is not input into the amplifier, the amplifier amplifies a voltage signal input from a power source for driving the amplifier.

12 Claims, 17 Drawing Sheets

SIGNAL PROCESSOR

BACKGROUND OF THE INVENTION

Field of the Invention

The invention relates to a signal processor and a radar apparatus.

Description of the Background Art

Conventionally, a radar apparatus installed in a vehicle or the like transmits a transmission wave from a transmission antenna, receives a reflected wave from a target at a receiving antenna, and derives a target location to the vehicle (radar apparatus). The reflected wave from the target becomes a minuter signal as the distance from the target is farther. Therefore, the radar apparatus has a configuration considering low noise so that a received signal is not buried in the noise generated in the circuit in the radar apparatus, and so as to surely derive even a distant target.

However, when oscillation of output due to an abnormality in a power circuit in the radar apparatus or a switching noise is generated, they are calculated as a peak depending on the oscillation frequency, a frequency of the noise, or their amplitude level. As a result, there is a possibility that they are erroneously detected as a target.

Meanwhile, in the case where a special oscillation prevention configuration is provided in the power circuit, or where a configuration for detecting a switching noise and for suppressing the noise generation is separately provided, there is a problem that the cost of the radar apparatus is increased and downsizing of the radar apparatus becomes difficult.

SUMMARY OF THE INVENTION

According to one aspect of the invention, a signal processor includes an amplifier that amplifies a control signal which is input into the amplifier to output an amplified control signal; and a controller that performs predetermined control based on the amplified control signal. When the control signal is not input into the amplifier, the amplifier amplifies a voltage signal input from a power source for driving the amplifier.

The signal processor amplifies a voltage signal when a control signal is not input into the amplifier. That is, the signal processor performs amplification processing for detecting an abnormality in the power source or the like in a blank time when the amplifier does not amplify the control signal. This allows the amplifier to be shared, and it is possible to perform the processing for detecting an abnormality in the power source or the like, without providing a new configuration.

According to another aspect of the invention, the controller detects presence or absence of an abnormality in an output voltage of the power source based on the voltage signal amplified by the amplifier.

Since the controller can detect the presence or absence of an abnormality in the output voltage of the power source, it is possible to avoid erroneous control caused by an abnormality or the like, and to perform appropriate control.

Therefore, an object of the invention is to provide the technology for preventing the oscillation due to an abnormality in the power output and the erroneous detection due to a switching noise without providing a new configuration.

These and other objects, features, aspects and advantages of the present invention will become more apparent from the following detailed description of the present invention when taken in conjunction with the accompanying drawings.

DESCRIPTION OF THE EMBODIMENTS

Hereinafter, some embodiments of the invention are described based on attached drawings. In the following, a radar apparatus is explained as an example of a signal processor. However, the invention is not limited to the radar apparatus. The invention is applicable to anything that amplifies an input signal and uses it for processing. The invention can be used especially suitably for an apparatus that amplifies a minute signal and uses it for processing, such as a radar apparatus and a medical apparatus.

1. First Embodiment

<1-1. Configuration>

Figure 1:
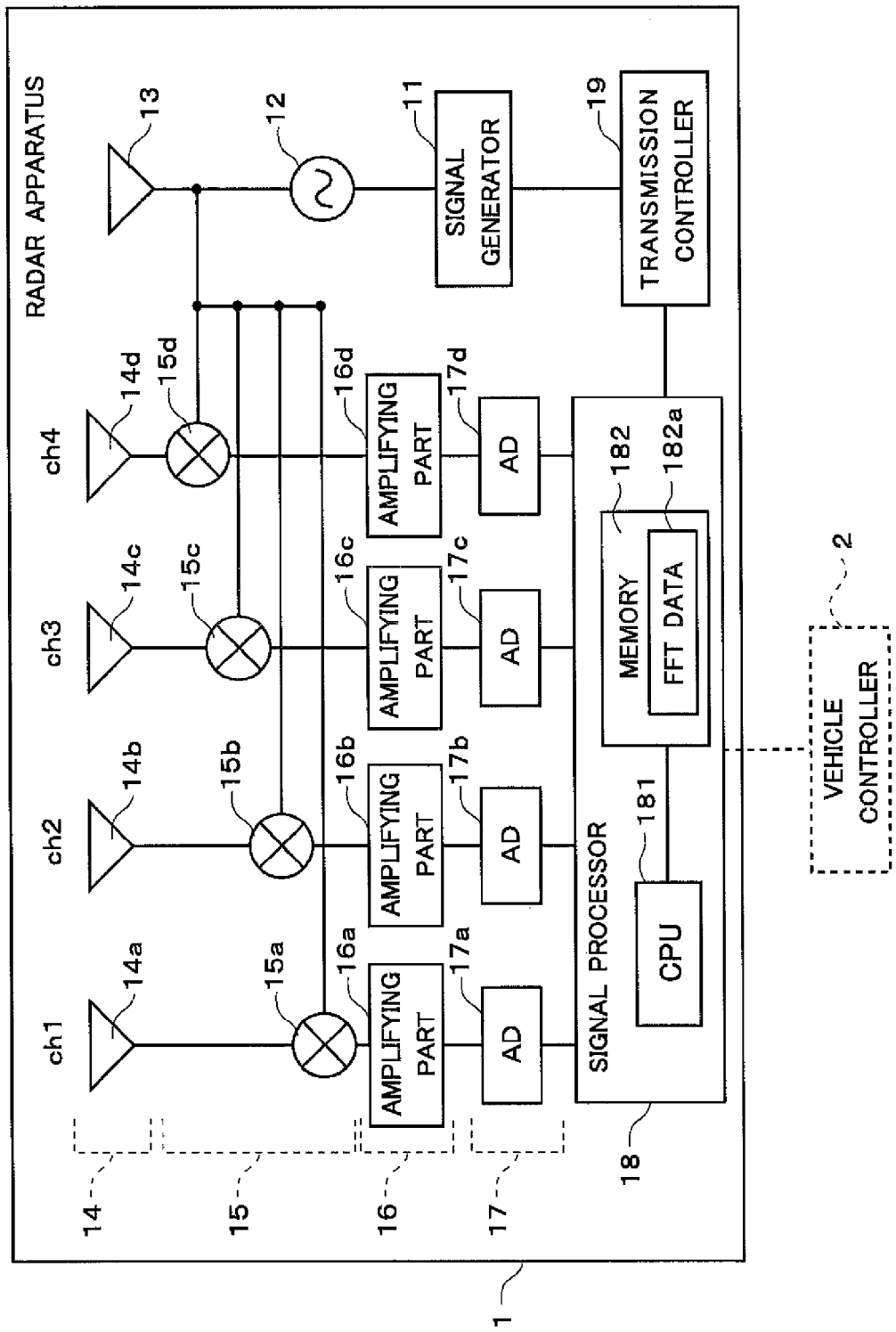
FIG. 1 is a block diagram of a radar apparatus.

First, the configuration of a radar apparatus 1 of the invention is explained. FIG. 1 is a block diagram that shows a schematic configuration of the radar apparatus 1. The radar apparatus 1 is mainly provided in the vicinity of a bumper in front of a vehicle. The radar apparatus 1 scans a predetermined scanning range at one scanning, and derives a distance between the vehicle and a target. The radar apparatus 1 also derives a speed of the target, and relative velocity which is the speed of the target relative to the speed of the vehicle. Information such as the derived distance is output to a vehicle controller 2, and the vehicle controller 2 performs a variety of control based on the input information.

The radar apparatus 1 includes a signal generator 11, an oscillator 12, a transmission antenna 13, a receiving antenna 14, a mixer 15, an amplifying part 16, an AD (Analog to Digital) converter 17, a signal processor 18, and a transmission controller 19.

The signal generator 11 generates, for example, a modulated signal whose voltage changes in a triangular wave form, based on a signal input from the transmission controller 19 described later.

The oscillator 12 is a voltage-controlled oscillator whose oscillation frequency is controlled by a voltage. The oscillator 12 performs frequency modulation of a signal of a predetermined frequency (for example, 76.5 GHz) based on the modulated signal which is generated by the signal generator 11, and outputs the signal as a transmission signal in a frequency band having the predetermined frequency (76.5 GHz) as the center frequency to the transmission antenna 13.

The transmission antenna 13 is an antenna that outputs a transmission wave related to the transmission signal to the outside of a vehicle. The transmission antenna 13 is connected to the oscillator 12, and outputs the transmission wave corresponding to the transmission signal input from the oscillator 12 to the outside of the vehicle. In the first embodiment, the configuration using one transmission antenna is explained. However, the invention may have the configuration using a plurality of transmission antennas such as two or four antennas.

The receiving antenna 14 includes a plurality of array antennas that receive a reflected wave when the transmission wave transmitted from the transmission antenna 13 is reflected by an object. In the first embodiment, as the receiving antennas, the radar apparatus 1 includes four receiving antennas 14a, 14b, 14c, and 14d. Each of the receiving antennas 14a to, 14b, 14c, and 14d is disposed at regular intervals.

The mixer 15 is provided with each of the receiving antennas 14a, 14b, 14c, and 14d, and mixes a received signal with a transmission signal. When mixing the received signal and the transmission signal, the mixer 15 generates a beat signal which is the signal of the difference between the transmission signal and the received signal, and outputs the beat signal to the amplifying part 16.

The amplifying part 16 amplifies the beat signal input from the mixer 15 at a predetermined amplification factor, and outputs the amplified beat signal to the AD converter 17. The amplifying part 16 is also provided with each of the receiving antennas 14a, 14b, 14c, and 14d as well as the mixer 15. In addition to the beat signal, a voltage signal is input from a power source, and the amplifying part 16 also amplifies the input voltage signal. This is because the signal processor 18 in the latter part detects presence or absence of an abnormality in an output voltage of the power source. The detailed configuration of the amplifying part 16 is described later.

The AD converter 17 converts the analog beat signal into a digital signal. The AD converter 17 samples the analog beat signal in a predetermined cycle, and derives a plurality of sampling data. Then, the AD converter 17 converts the analog beat signal into the digital signal by quantizing the sampled data, and outputs the digital beat signal to the signal processor 18. The AD converter 17 is also provided with each of the receiving antennas 14a, 14b, 14c, and 14d as well as the mixer 15.

The signal processor 18 is a computer that includes a CPU 181 and a memory 182. The signal processor 18 performs FFT processing to the digital beat signal output from the AD converter 17, obtains FFT data and stores the FFT data in the memory 182. Then, the signal processor 18 extracts a signal corresponding to a predetermined condition from beat signals of the FFT data as a peak signal used for deriving a target. Extraction of the peak signal is performed in each of an UP section and a DOWN section. Then, the signal processor 18 pairs a peak signal of the UP section and a peak signal of the DOWN section to derive target information. The signal processor 18 also detects the presence or absence of an abnormality in the output voltage of the power source based on the voltage signal.

The memory 182 stores execution programs such as various kinds of arithmetic processing performed by the CPU 181. The memory 182 also stores multiple pieces of target information derived by the signal processor 18. For example, the memory 182 stores the target information (longitudinal distance, lateral distance and relative velocity of the target) derived in past processing and this processing. The memory 182 further stores FFT data 182a obtained by the FFT processing. The FFT data 182a also includes, in addition to the FFT data obtained in this target derivation processing, the FFT data obtained in the past target derivation processing. What is more, when there is an abnormality in the output voltage of the power source, the memory 182 stores the information about the abnormality.

The transmission controller 19 is connected to the signal processor 18, and outputs a signal for controlling the signal generator 11 which generates a modulated signal, based on the signal from the signal processor 18.

Figure 2:
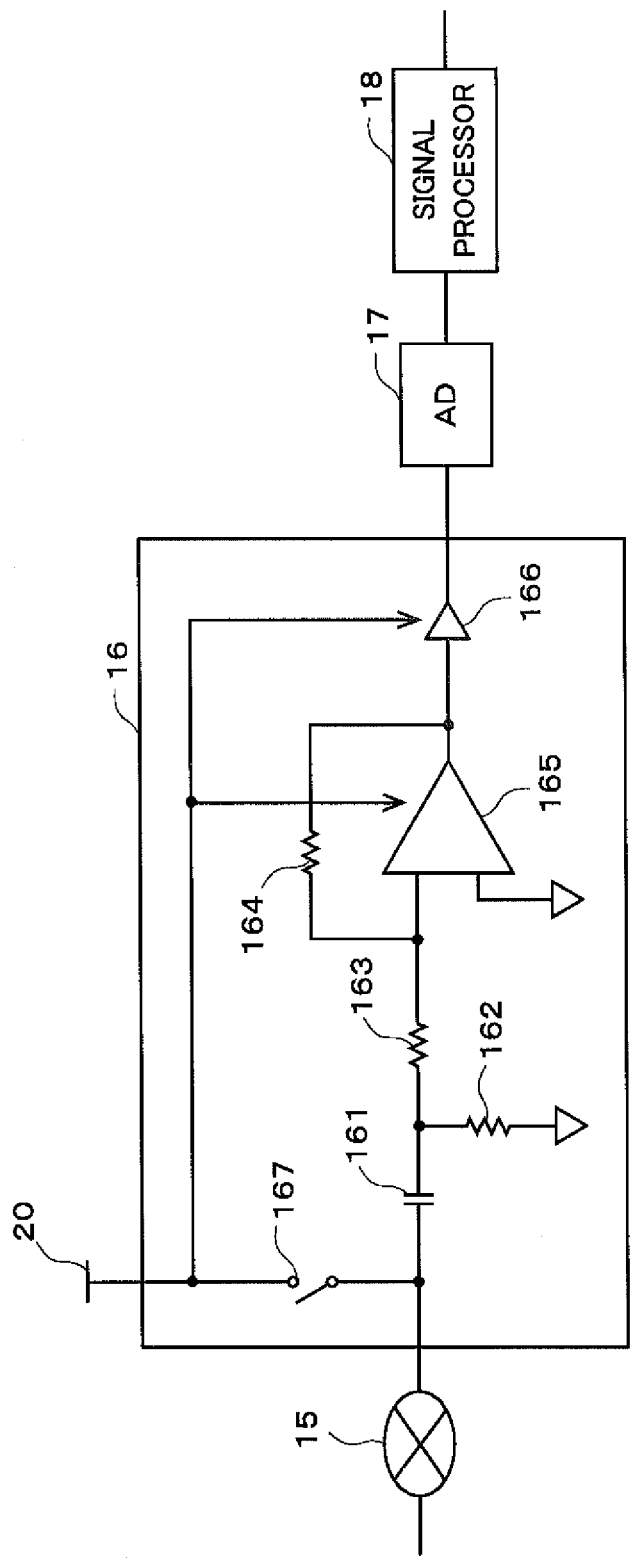
FIG. 2 shows an amplifying part.

Next, the configuration of the amplifying part 16 is explained more concretely. FIG. 2 is a block diagram that shows the configuration of the amplifying part 16. As shown in FIG. 2, as shown in FIG. 2, the amplifying part 16 includes a capacitor for HPF 161, resistance for HPF 162, first resistance for gain setting 163, second resistance for gain setting 164, an amplifier 165, a buffer amplifier 166, and a switch 167.

As described above, after amplifying the beat signal input from the mixer 15 at the predetermined amplification factor, the amplifying part 16 outputs the beat signal to the AD converter 17. Concretely, a DC component is removed from the beat signal input into the amplifying part 16 by the capacitor for HPF 161 and the resistance for HPF 162, and only an AC component of the beat signal is input into the amplifier 165. The beat signal input into the amplifier 165 is output after it is amplified by the first resistance for gain setting 163 and the second resistance for gain setting 164 at the predetermined prescribed amplification factor. Then, the amplified beat signal is output to the AD converter 17 in the latter part through the buffer amplifier 166.

In addition, a power source 20 for driving is connected to the amplifier 165 and the buffer amplifier 166. The amplifier 165 and the buffer amplifier 166 are driven when a voltage is applied from the power source 20. The power source 20 is also connected to the fore part of the capacitor for HPF 161 through the switch 167. That is, when the switch 167 is turned on, the voltage signal from the power source 20 is also input into the amplifier 165. On the other hand, when the switch 167 is turned off, the voltage signal from the power source 20 is not input into the amplifier 165. The on or off of the switch 167 is controlled by the signal from the signal processor 18.

When the switch 167 is turned on, the voltage signal from the power source 20 is input into the amplifier 165 via the capacitor for HPF 161 or the like as well as the beat signal. That is, the DC component of the voltage signal is removed, and only the AC component is input into the amplifier 165. After being amplified by the amplifier 165 at the predetermined amplification factor, the voltage signal is output to the AD converter 17 through the buffer amplifier 166. Thus, even if the voltage signal is a minute signal, it is possible to detect the amplified voltage signal.

<1-2. Processing>

Figure 3:
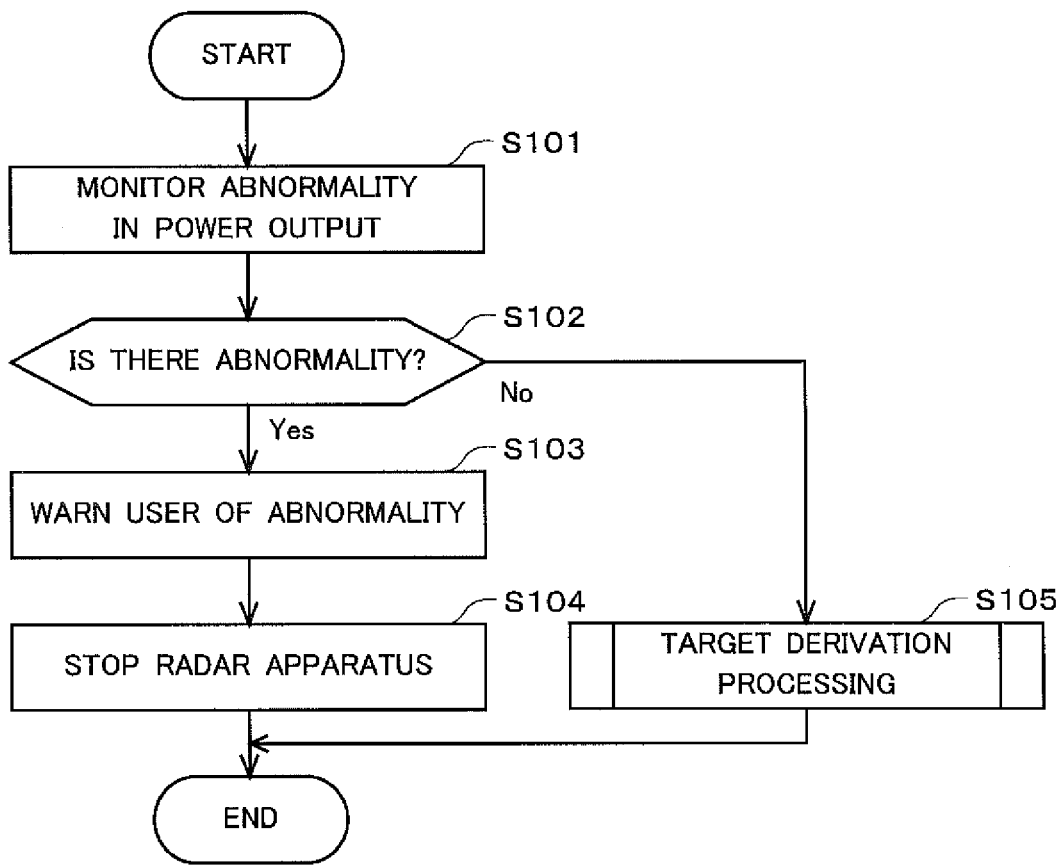
FIG. 3 is a flowchart that shows processing of the radar apparatus.

Next, processing of the radar apparatus 1 is explained. FIG. 3 is a flowchart that shows the processing of the radar apparatus 1.

When the radar apparatus 1 is powered on and started, the radar apparatus 1 monitors the presence or absence of an abnormality in the output voltage of the power source (step S101). Concretely, when detecting that its own apparatus is started, the radar apparatus 1 turns on the switch 167 of the amplifying part 16 under control by the signal processor 18 before starting the target derivation processing. Then, the power source 20 is connected to the amplifier 165, and the voltage signal of the power source 20 is input into the amplifier 165 via the capacitor for HPF 161. The amplifier 165 amplifies the input voltage signal at the predetermined amplification factor. The amplified voltage signal is input into the signal processor 18 via the AD converter 17. Then, the signal processor 18 detects the presence or absence of an abnormality in the output voltage of the power source 20 based on the input voltage signal. That is, the signal processor 18 determines whether there is an abnormality.

The case where there is an abnormality in the output voltage of the power source 20 includes, for example, a case where the output voltage of the power source 20 is oscillating. Therefore, in this specification, as an abnormality in the output voltage of the power source 20, the state where the output voltage of the power source 20 is oscillating is explained as an example. Hereinafter, "an abnormality in the output voltage of the power source" is described simply as "an abnormality in power output," considering that the power output is abnormal.

That is, when determining that the output voltage is oscillating based on the input voltage signal, the signal processor 18 determines that there is an abnormality in the power output. The determination on whether the output voltage is oscillating can be made, for example, by the FFT processing. The case where the output voltage is oscillating is defined as a case where fluctuation in voltage is repeated in the same cycle. Therefore, when the FFT processing is performed to the oscillating voltage signal, a peak exists at the oscillating frequency (oscillation frequency). Thus, when the result of performing the FFT processing to the power output has a peak at any frequency, it can be determined that the output voltage of the power source is oscillating at the frequency. Then, the signal processor 18 detects that the output voltage is oscillating at the oscillation frequency, and detects that there is an abnormality in the power output.

The method of determining on whether the output voltage of the power source 20 is oscillating is not limited to this. Another method can be used if it is the method by which the signal processor 18 can determine that the output voltage of the power source is oscillating. The kind of the abnormality in the power output is also not limited to oscillation, and it may be another abnormality.

When determining that there is an abnormality in the power output (Yes at the step S102), the radar apparatus 1 warns a user that there is an abnormality (step S103), and driving of the radar apparatus 1 is stopped (step S104). When there is an abnormality in the power output, there is a possibility that the signal processor 18 erroneously detects the target. Therefore, in the first embodiment, when there is an abnormality in the power output, the radar apparatus 1 is stopped. However, the user may not know why the radar apparatus 1 is not driven. Therefore, by warning the user, the radar apparatus 1 informs the user that the driving of the radar apparatus 1 is stopped.

The radar apparatus 1 can warn the user by using a display or a sound, etc. For example, a method of causing a display to display that there is an abnormality in the power output, and a method of outputting a sound may be used. However, another method may be used if it is the method by which the radar apparatus 1 can warn the user.

When determining that there is an abnormality in the power output, the signal processor 18 stops the driving of each configuration of the radar apparatus 1. That is, the radar apparatus 1 stops transmission of a transmission wave and reception of a received wave. Thus, the radar apparatus 1 stops the target derivation processing. The method of stopping the driving of the radar apparatus 1 is not limited to stopping the driving of all configurations, and the driving of a part of the configuration may be stopped. For example, a method of performing the transmission of a transmission wave and reception of a received wave, but not performing the target derivation processing by the signal processor 18 may be used. Also, another method of performing the transmission of a transmission wave and reception of a received wave and the target derivation processing by the signal processor 18, but not performing the output of target information may be used.

Figure 4:
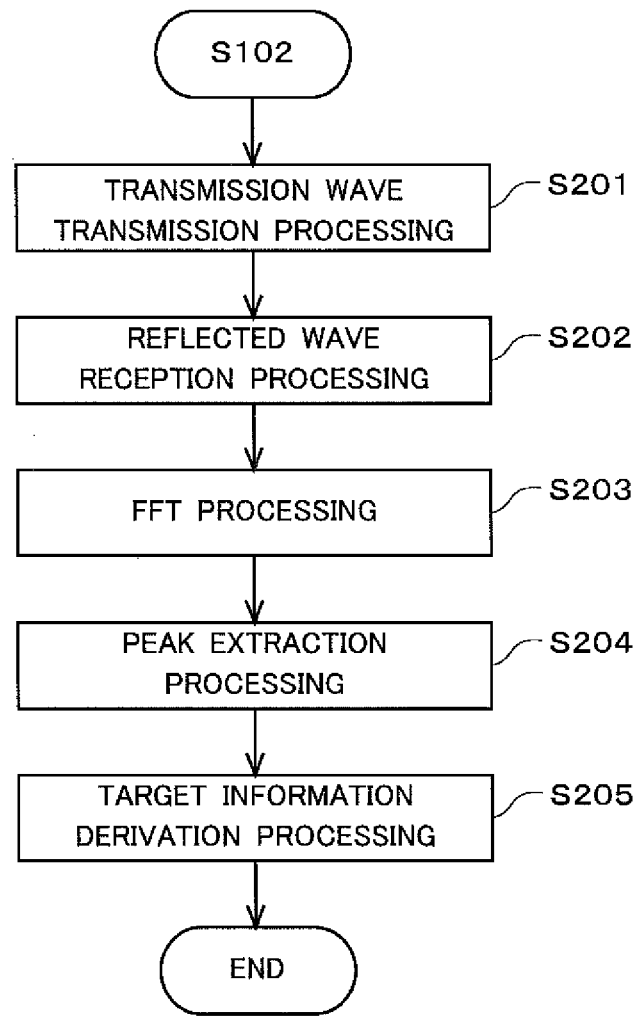
FIG. 4 is a flowchart that shows target derivation processing.

On the other hand, when determining that there is no abnormality in the power output (No at the step S102), the radar apparatus 1 performs the target derivation processing (step S105). Next, the target derivation processing of the radar apparatus 1 is explained. FIG. 4 is the flowchart that shows the target derivation processing of the radar apparatus 1.

The radar apparatus 1 transmits a transmission wave from the transmission antenna 13 (step S201), and receives a reflected wave arriving by reflection of the transmission wave on the target by the receiving antenna 14 (step S202). Then, the radar apparatus 1 generates a beat signal (control signal) that is a differential signal between the transmission signal corresponding to the transmission wave and the received signal corresponding to the reflected wave. The analog beat signal is amplified by the amplifying part 16, and the amplified beat signal is input into the signal processor 18 after it is converted into the digital signal by the AD converter 17.

Next, the radar apparatus 1 performs the FFT processing to the digital beat signal (step S203). By performing this step, the radar apparatus 1 obtains the FFT data including a signal level value for each frequency for the beat signal. The FFT data is obtained for each of the receiving antennas 14a, 14b, 14c, and 14d.

Then, the radar apparatus 1 extracts a peak signal used for deriving the target information from the FFT data (step S204). Concretely, the radar apparatus 1 extracts the signal whose signal level exceeds a predetermined threshold in the FFT data as a peak signal.

Subsequently, the radar apparatus 1 derives the target information based on the extracted peak signal (step S205). The target information is, for example, the direction (angle) of the target to the radar apparatus 1, the distance from the radar apparatus 1 to the target, and the relative velocity relative to the radar apparatus 1 and the like. The existing method can be used so as to derive each piece of the target information by using the peak signal.

In this way, in the first embodiment, the radar apparatus 1 monitors the presence or absence of an abnormality in the power output. When there is no abnormality in the power output, derivation processing of the target information is performed by the radar apparatus 1. When there is an abnormality in the power output, the radar apparatus 1 is stopped. Therefore, it is possible to prevent erroneous detection of the target caused by the abnormality in the power output.

Since the presence or absence of an abnormality in the power output is monitored before the radar apparatus 1 starts the target derivation processing, the amplifying part 16 used for the target derivation processing can be used in order to monitor the presence or absence of an abnormality in the power output. Since it is not necessary to separately provide the configuration for monitoring an abnormality in the power output and the configuration of the radar apparatus 1 can be shared, it is possible to avoid increasing costs and upsizing of the radar apparatus.

2. Second Embodiment

Next, the second embodiment is explained. In the first embodiment, the configuration for preventing the erroneous detection of the target by stopping the radar apparatus in the case where there is an abnormality in the power output is explained. However, the invention may have a configuration for preventing the erroneous detection of the target without stopping the radar apparatus (That is, while performing the target derivation processing). Therefore, in the second embodiment, a method by which the radar apparatus prevents the erroneous detection of the target while performing the target derivation processing is explained.

<2-1. Configuration>

A radar apparatus 1 of the second embodiment has almost the same configuration as that of the radar apparatus 1 shown in FIG. 1. Therefore, the explanation about the configuration of the radar apparatus 1 of the second embodiment is omitted.

<2-2. Processing>

Figure 5:
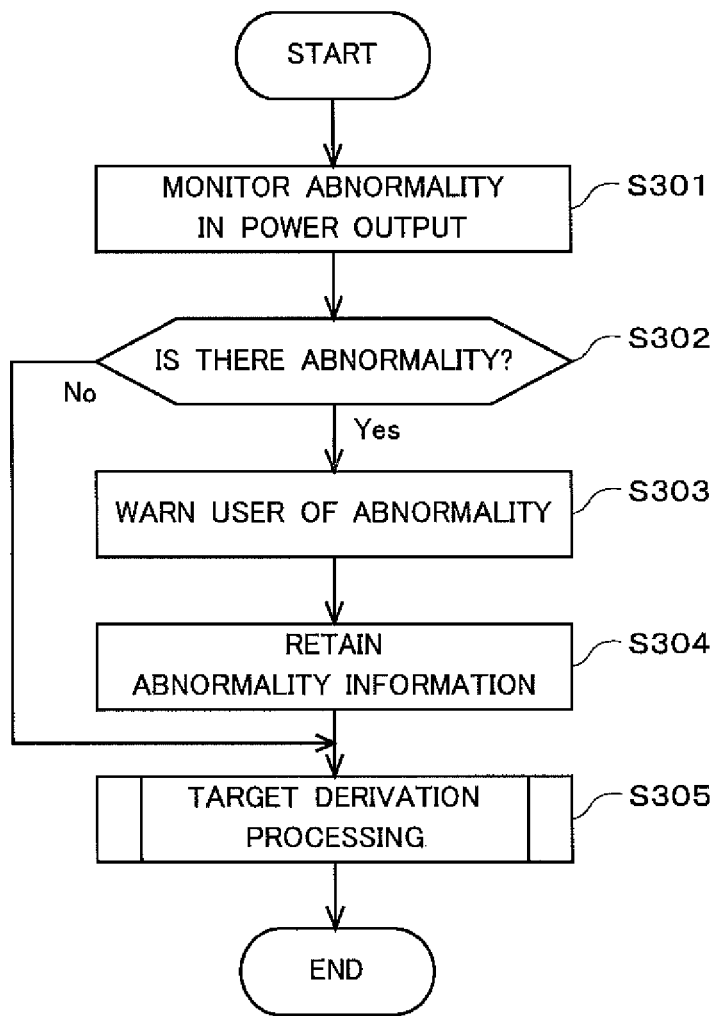
FIG. 5 is another flowchart that shows the processing of the radar apparatus.

Processing of the radar apparatus 1 of the second embodiment is explained. FIG. 5 is the flowchart that shows the processing of the radar apparatus 1 of the second embodiment. A part of the processing of the second embodiment is the same as the first embodiment. Therefore, in the explanation of the second embodiment, the processing different from the first embodiment is mainly explained.

When the radar apparatus 1 is powered on and started, the radar apparatus 1 monitors the presence or absence of an abnormality in the power output (step S301). This processing is the same processing as the step S101 described above. When determining that there is no abnormality in the power output (No at the step S302), the radar apparatus 1 performs target derivation processing (step S305).

On the other hand, when determining that there is an abnormality in the power output (Yes at the step S302), the radar apparatus 1 warns a user that the power output is abnormal (step S303). This processing is the same processing as the step S103 described above.

Then, the radar apparatus 1 retains abnormality information (step S304). The abnormality information is the information about an abnormality, and is the information such as oscillation frequency in the second embodiment. That is, when an output voltage of a power source 20 is oscillating, the radar apparatus 1 stores the oscillation frequency in a memory 182 as the abnormality information.

Figure 6:
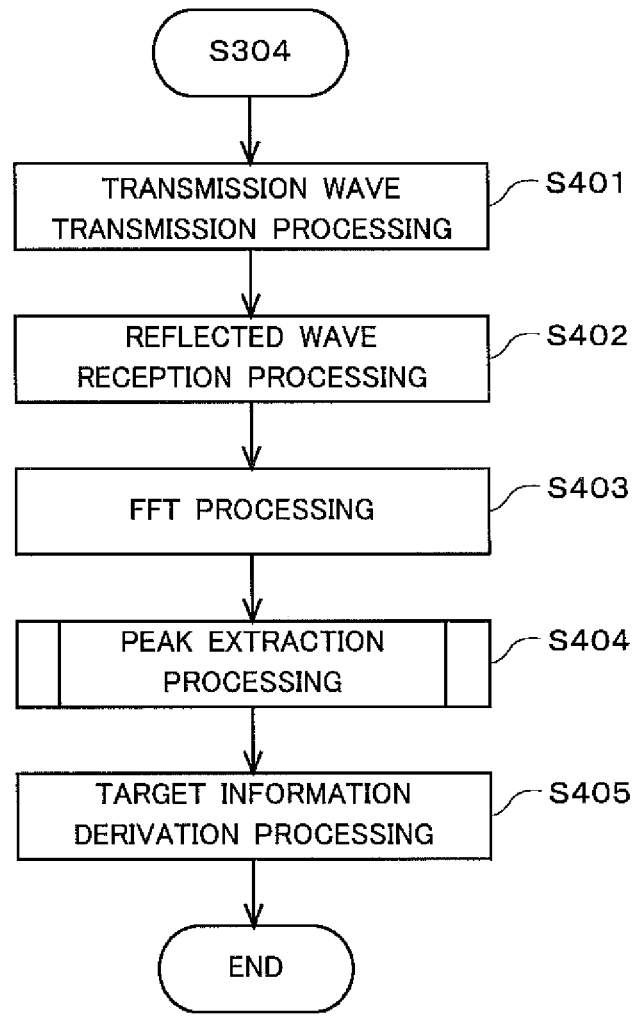
FIG. 6 is another flowchart that shows the target derivation processing.

Next, the radar apparatus 1 performs the target derivation processing (step S305). The target derivation processing is explained using FIG. 6. FIG. 6 is the flowchart that shows the target derivation processing of the second embodiment.

In the target derivation processing of the second embodiment, peak extraction processing differs in the target derivation processing explained in the first embodiment. In the following, the peak extraction processing is mainly explained.

In the target derivation processing (step S305), the radar apparatus 1 performs transmission wave transmission processing (step S401), reflected wave reception processing (step S402), and FFT processing (step S403). Each of the processing is the same processing as the step S101 to the step S103 explained in the first embodiment. By performing these steps, the radar apparatus 1 obtains FFT data of a beat signal corresponding to a target.

Figure 7:
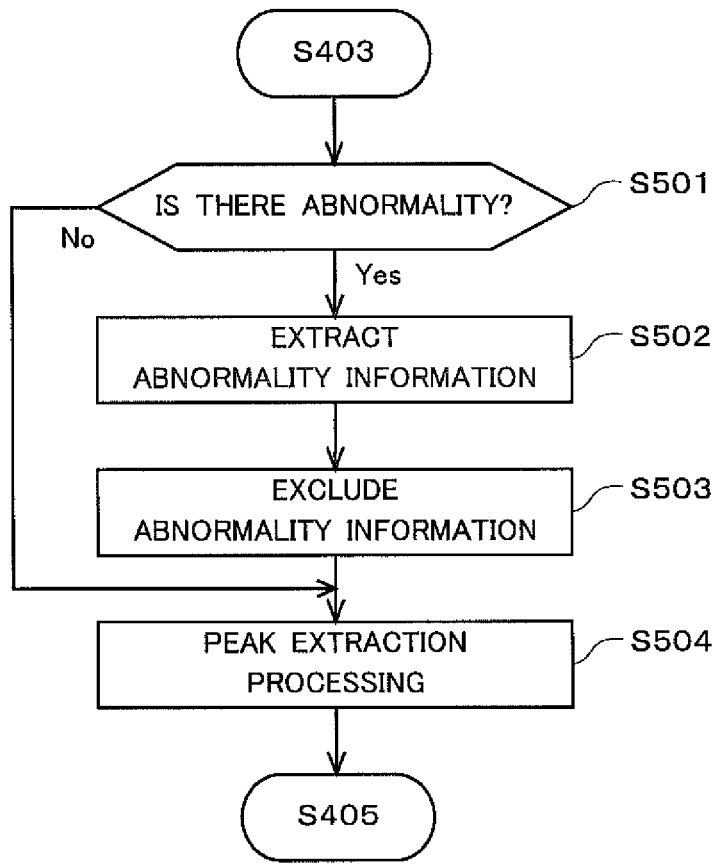
FIG. 7 is a flowchart that shows peak extraction processing.

Then, the radar apparatus 1 performs the peak extraction processing (step S404). Next, the peak extraction processing is explained based on FIG. 7. FIG. 7 is the flowchart that shows the peak extraction processing of the second embodiment.

In the peak extraction processing, first, the radar apparatus 1 verifies whether there is an abnormality in the power output (step S501). This means, in the processing for monitoring an abnormality in the power output (step S301), the verification whether it is determined that there is an abnormality in the power output. The verification may be determined by a flag indicating the presence or absence of an abnormality, and may be determined based on the contents of the abnormality information. For example, if a flag is set to indicate the result of the presence or absence of an abnormality, the presence or absence of an abnormality can be determined by checking the flag. Also, it can be determined that there is an abnormality when the abnormality information is stored in the memory 182.

When there is an abnormality in the power output (Yes at the step S501), the radar apparatus 1 extracts the abnormality information (step S502). That is, when the output voltage of the power source 20 is oscillating, the radar apparatus 1 reads out the oscillation frequency stored as the abnormality information from the memory 182.

Then, the radar apparatus 1 excludes the readout abnormality information (step S503). Concretely, the radar apparatus 1 excludes the data in a part corresponding to the oscillation frequency obtained as the abnormality information from the FFT data obtained by the FFT processing. That is, the radar apparatus 1 masks the oscillation frequency part of the FFT data. Thus, the FFT data from which a peak signal caused by an abnormality in the power output is excluded (FFT data after exclusion (exclusion signal)) is obtained.

Figure 8A:
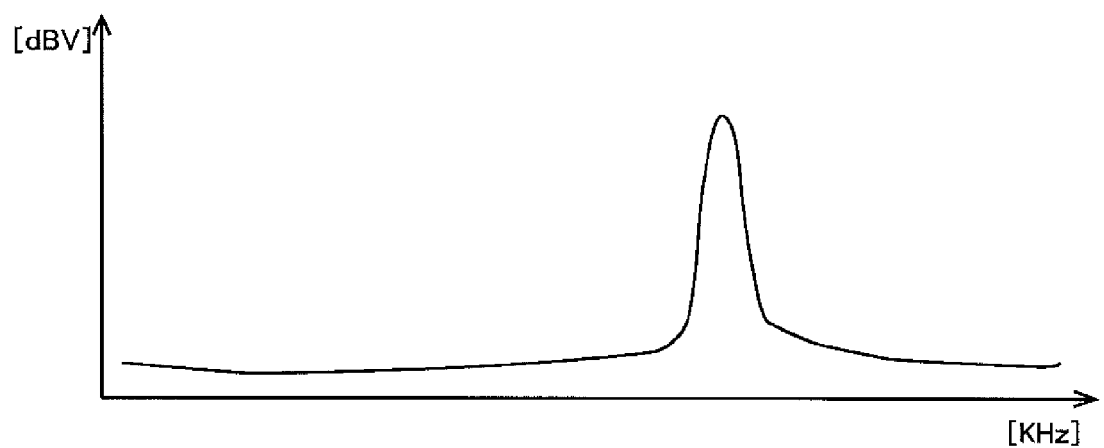
FIG. 8A shows FFT data.
Figure 8B:
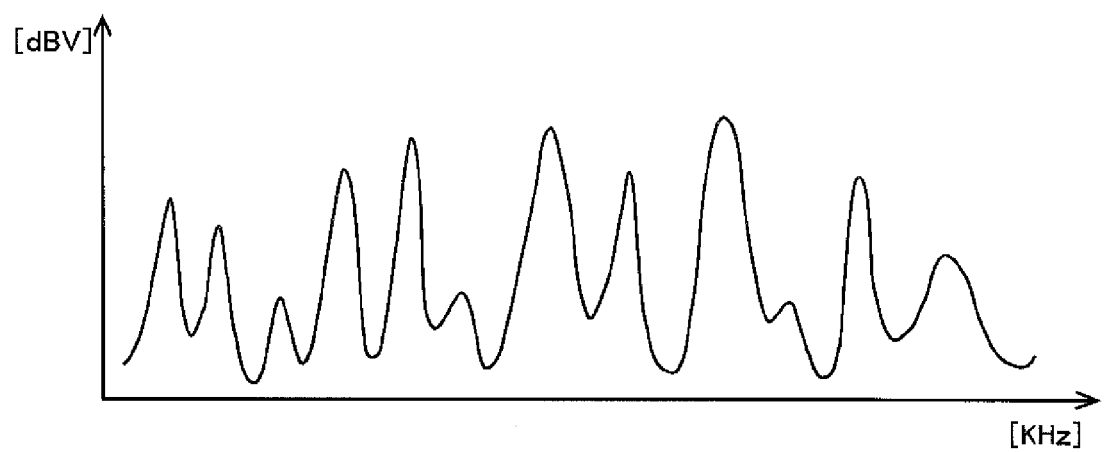
FIG. 8B shows another FFT data.
Figure 8C:
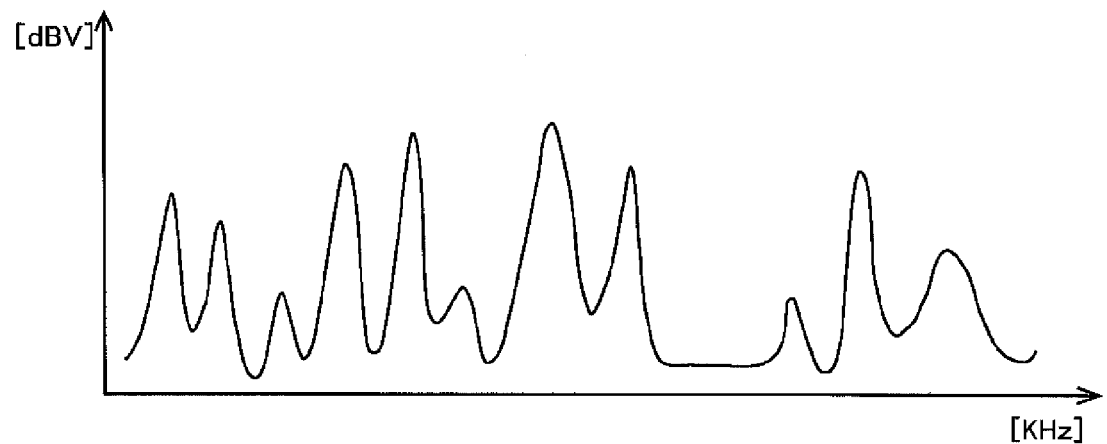
FIG. 8C shows another FFT data.

Next, the content regarding acquisition of the FFT data after exclusion is explained using FIG. 8A, FIG. 8B, and FIG. 8C. Each of FIG. 8A, FIG. 8B, and FIG. 8C shows the FFT data. FIG. 8A is the FFT data which is obtained when the radar apparatus 1 monitors the presence or absence of an abnormality in the power output. The FFT data becomes the data corresponding to the abnormality information. FIG. 8B is the FFT data of a beat signal. FIG. 8C is the FFT data after exclusion.

As shown in FIG. 8A, in the case .where the output voltage of the power source 20 is oscillating, a peak exists in the oscillation frequency part of the spectrum which is obtained by performing the FFT processing to a voltage signal. Since the voltage signal output from the power source 20 is superimposed on the beat signal, as shown in FIG. 8B, a peak also exists in the oscillation frequency part of the spectrum which is obtained by performing the FFT processing to the beat signal.

Therefore, the radar apparatus 1 masks the data in the part corresponding to the oscillation frequency so as not to use the abnormality information for the peak extraction processing in the FFT data of the beat signal. Thereby, the FFT data after exclusion from which data in the vicinity of the oscillation frequency is excluded as shown in FIG. 8C can be obtained.

In FIG. 7 back again, the radar apparatus 1 performs the peak extraction processing using the FFT data after exclusion (step S504). The peak extraction processing can be performed in the same way as the first embodiment. That is, the radar apparatus 1 extracts a signal whose signal level exceeds a predetermined threshold in the FFT data after exclusion as a peak signal. In this case, the FFT data after exclusion excludes the data in the part corresponding to the oscillation frequency. Therefore, the erroneous detection of the peak signal caused by oscillation of the output voltage of the power source 20 as a target can be avoided.

Even in the case where there is no abnormality in the power output (No at the step S501), the radar apparatus 1 performs the peak extraction processing in the same manner (step S504). In this case, since there is no processing for excluding the abnormality information, the radar apparatus 1 extracts a peak signal from the FFT data obtained from the beat signal.

Then, in FIG. 6 back again, the radar apparatus 1 performs derivation processing of target information based on the extracted peak signal (step S405). This processing can be performed in the same way as the step S205 described above.

In this way, in the second embodiment, when there is an abnormality in the power output, the radar apparatus 1 excludes the abnormality information, and extracts a peak signal. That is, when the output voltage of the power source is oscillating, by masking the part corresponding to the oscillation frequency in the FFT data, the target derivation processing based on the FFT data from which the peak signal caused by the oscillation of power supply voltage is excluded is available. As a result, it is possible to prevent the erroneous detection of the target.

3. Third Embodiment

Next, the third embodiment is explained. In the second embodiment, when there is an abnormality in the power output, the peak extraction processing is performed based on the FFT data from which the abnormality information is excluded. Concretely, when the output voltage of the power source is oscillating, the peak extraction processing is performed using the FFT data after exclusion which masks the oscillation frequency part of the FFT data. As another method, in addition to masking the oscillation frequency, the method of subtracting only a peak signal caused by the oscillation of the power supply voltage from the FFT data is cited. In the third embodiment, the method of using the FFT data which is obtained by subtracting the peak signal caused by the oscillation of the power supply voltage is explained.

<3-1. Configuration>

A radar apparatus 1 of the third embodiment also has almost the same configuration as that of the radar apparatus 1 shown in FIG. 1. Therefore, the explanation about the configuration of the radar apparatus 1 of the third embodiment is omitted.

<3-2. Processing>

Figure 9:
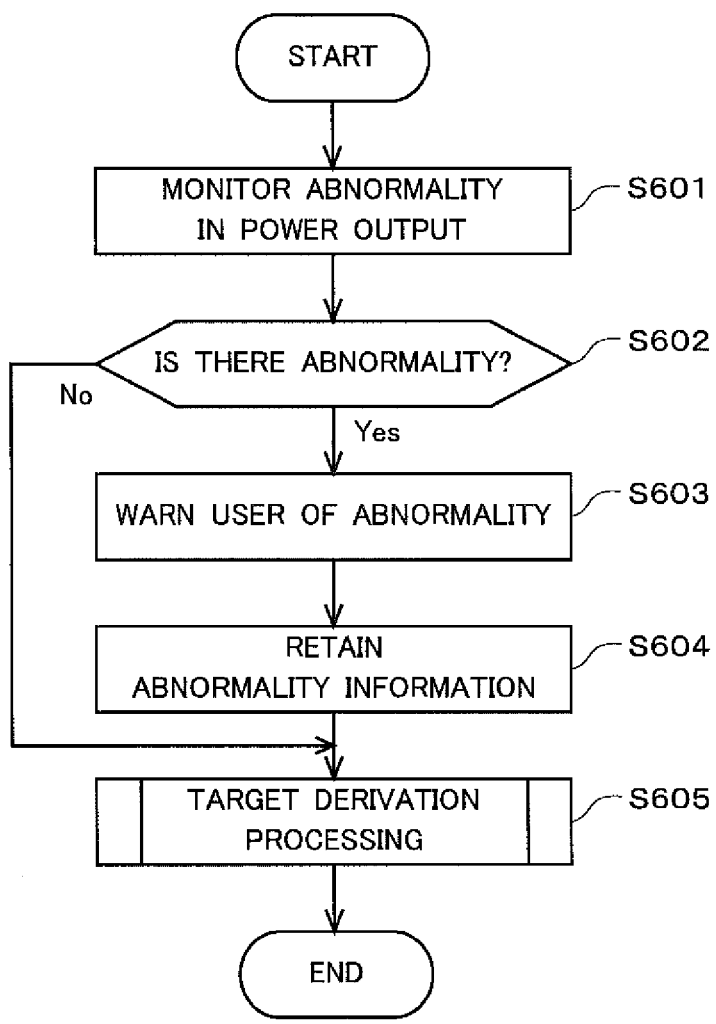
FIG. 9 is another flowchart that shows the processing of the radar apparatus.

Processing of the radar apparatus 1 of the third embodiment is explained. FIG. 9 is the flowchart that shows the processing of the radar apparatus 1 of the third embodiment. A part of the processing of the third embodiment is the same as the first embodiment. Therefore, in the explanation of the third embodiment, the processing different from the first embodiment is mainly explained.

When the radar apparatus 1 is powered on and started, the radar apparatus 1 monitors the presence or absence of an abnormality in the power output (step S601). This processing is the same processing as the step S101 described above. When determining that there is no abnormality in the power output (No at the step S602), the radar apparatus 1 performs target derivation processing (step S605).

On the other hand, when determining that there is an abnormality in the power output (Yes at the step S602), the radar apparatus 1 warns a user that the power output is abnormal (step S03). This processing is the same processing as the step S103 described above.

Then, the radar apparatus 1 retains abnormality information (step S604). The abnormality information is the information about an abnormality, and is the information such as oscillation frequency and a signal level value in the third embodiment. That is, when an output voltage of a power source 20 is oscillating, the radar apparatus 1 stores the oscillation frequency and the signal level value in a memory 182 as the abnormality information.

Figure 10:
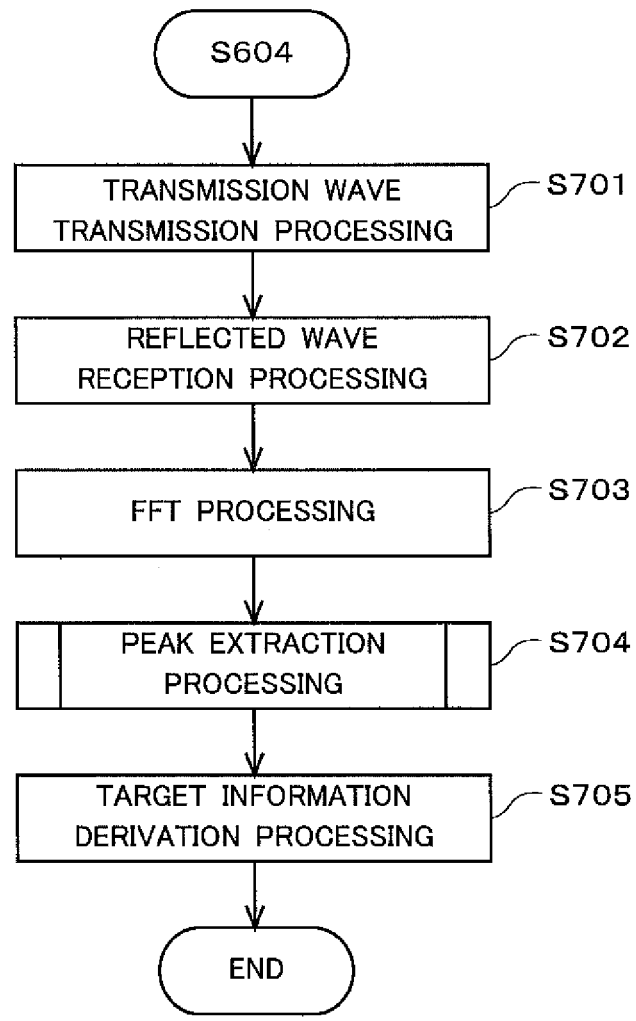
FIG. 10 is another flowchart that shows the target derivation processing.

Next, the radar apparatus 1 performs the target derivation processing (step S605). The target derivation processing is explained using FIG. 10. FIG. 10 is the flowchart that shows the target derivation processing of the third embodiment. In the target derivation processing of the third embodiment, peak extraction processing differs in the target derivation processing explained in the first embodiment. In the following, the peak extraction processing is mainly explained.

In the target derivation processing (step S605), the radar apparatus 1 performs transmission wave transmission processing (step S701), reflected wave reception processing (step S702), and FFT processing (step S703). Each of the processing is the same processing as the step S101 to the step S103 explained in the first embodiment. By performing these steps, the radar apparatus 1 obtains the FFT data of a beat signal corresponding to a target.

Figure 11:
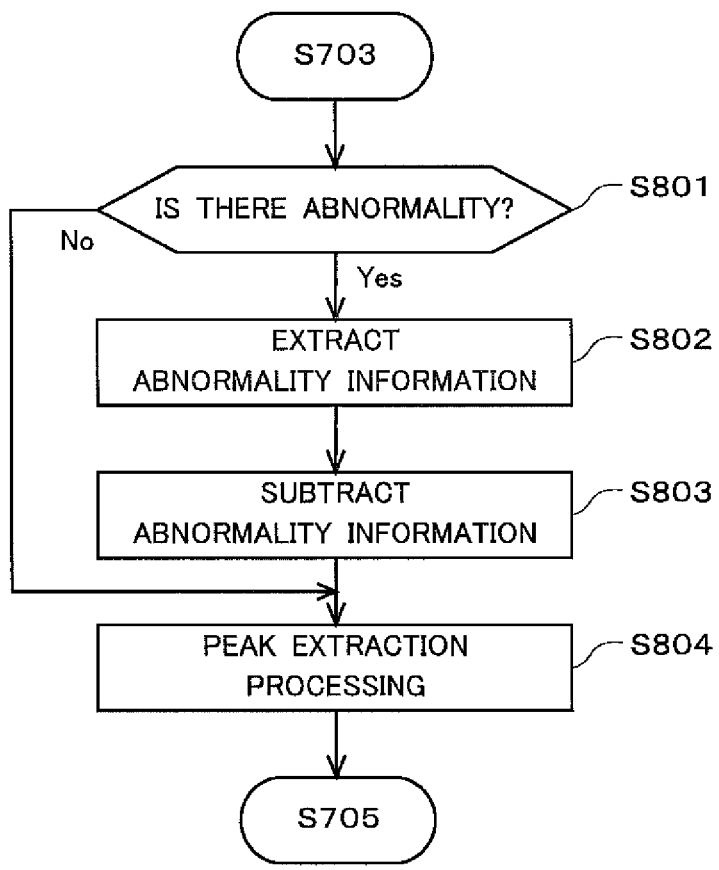
FIG. 11 is another flowchart that shows the peak extraction processing.

Then, the radar apparatus 1 performs the peak extraction processing (step S704). Next, the peak extraction processing is explained based on FIG. 11. FIG. 11 is the flowchart that shows the peak extraction processing of the third embodiment.

In the peak extraction processing, first, the radar apparatus 1 verifies whether there is an abnormality in the power output (step S801). This means, in the processing for monitoring an abnormality in the power output (step S601), the verification whether it is determined that there is an abnormality in the power output. The verification may be determined by a flag indicating the presence or absence of an abnormality, and may be determined based on the contents of the abnormality information. For example, if a flag is set to indicate the result of the presence or absence of an abnormality, the presence or absence of an abnormality can be determined by checking the flag. Also, it can be determined that there is an abnormality when the abnormality information is stored in the memory 182.

When there is an abnormality in the power output (Yes at the step S801), the radar apparatus 1 extracts the abnormality information (step S802). That is, when the output voltage of the power source 20 is oscillating, the radar apparatus 1 reads out the oscillation frequency and the signal level value stored as the abnormality information from the memory 182.

Then, the radar apparatus 1 subtracts the readout abnormality information (step S803). Concretely, the radar apparatus 1 subtracts the signal level value in the oscillation frequency obtained as the abnormality information from the FFT data obtained by the FFT processing. That is, the radar apparatus 1 subtracts only a peak signal caused by oscillation from the FFT data. Thus, the FFT data from which only a peak signal caused by an abnormality in the power output is removed (FFT data after subtraction (subtraction signal)) is obtained.

Figure 12A:
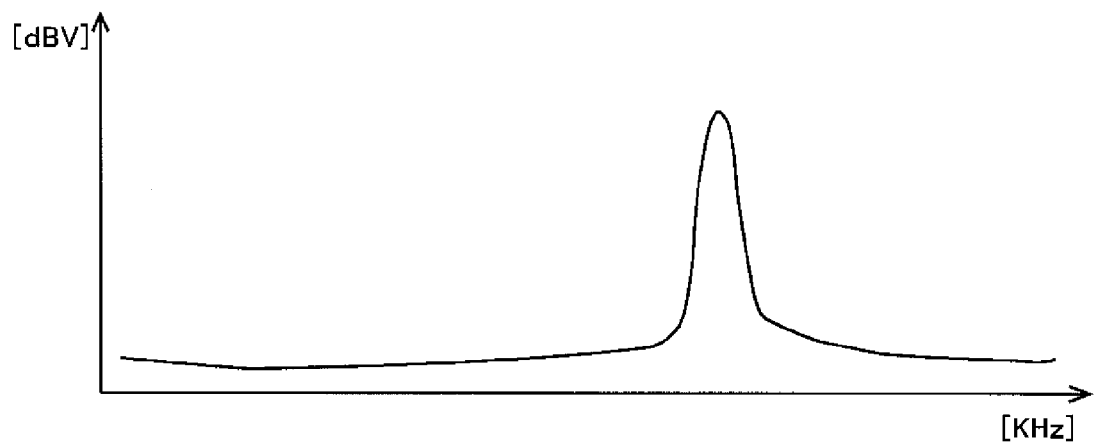
FIG. 12A shows another FFT data.
Figure 12B:
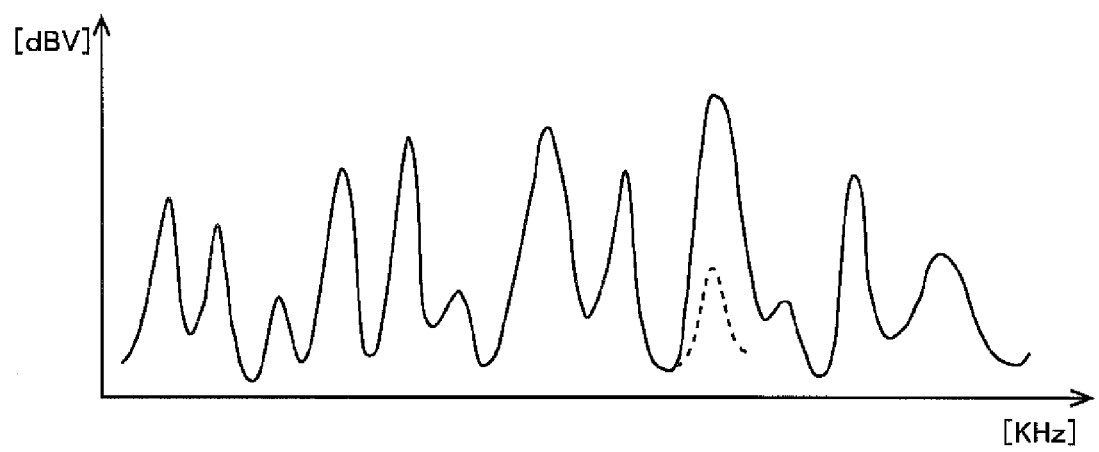
FIG. 12B shows another FFT data.
Figure 12C:
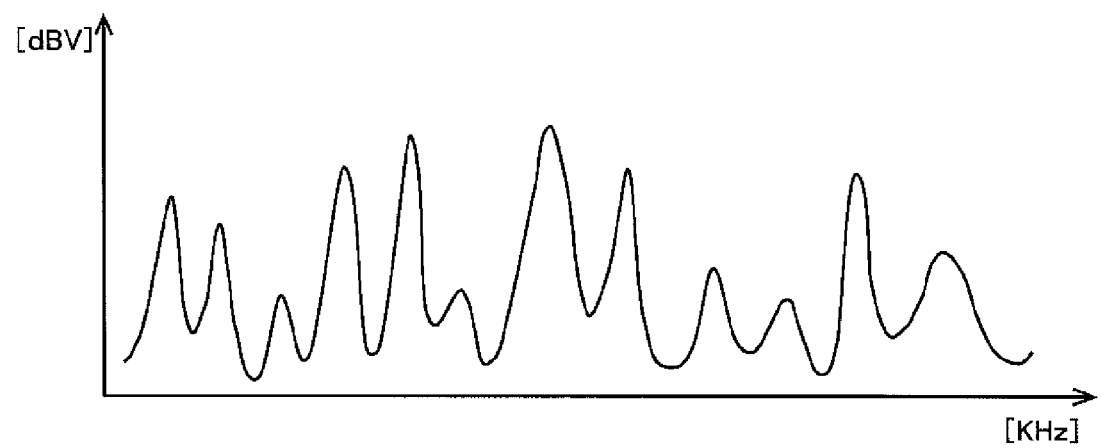
FIG. 12C shows another FFT data.

Next, the content regarding acquisition of the FFT data after subtraction is explained using FIG. 12A, FIG. 12B, and FIG. 12C. Each of FIG. 12A, FIG. 12B, and FIG. 12C shows the FFT data. FIG. 12A is the FFT data which is obtained when the radar apparatus 1 monitors the presence or absence of an abnormality in the power output. The FFT data becomes the data corresponding to the abnormality information. FIG. 12B is the FFT data of the beat signal. FIG. 12C is the FFT data after subtraction.

As shown in FIG. 12A, in the case where the output voltage of the power source 20 is oscillating, a peak exists in the oscillation frequency part of the spectrum which is obtained by performing the FFT processing to a voltage signal. Since the voltage signal output from the power source 20 is superimposed on the beat signal, as shown in FIG. 12B, a peak also exists in the oscillation frequency part of the spectrum which is obtained by performing the FFT processing to the beat signal. In FIG. 12B, the peak signal corresponding to the target is shown with a dotted line. As above, even when the peak signal corresponding to the target originally exists, in the case where the peak signal caused by oscillation of the power supply voltage is large, the peak signal corresponding to the target may be buried.

In such a case, if the part corresponding to the oscillation frequency is masked in the same manner as the second embodiment, even the peak signal corresponding to the target is removed, and the target which should originally exist cannot be detected in some cases. Therefore, in the third embodiment, the radar apparatus 1 subtracts only the peak signal caused by the oscillation of the power supply voltage in order to prevent the erroneous detection and non-detection.

Concretely, the radar apparatus 1 reads out the oscillation frequency and the signal level value stored as the abnormality information from the memory 182. Then, the radar apparatus 1 subtracts the data corresponding to the readout signal level value from the peak signal in the oscillation frequency part of the FFT data obtained from the beat signal. Thereby, as shown in FIG. 12C, the FFT data after subtraction which subtracts only the peak signal caused by the oscillation of the power supply voltage from the data in the vicinity of the oscillation frequency can be obtained.

In FIG. 11 back again, the radar apparatus 1 performs the peak extraction processing using the FFT data after subtraction (step S804). The peak extraction processing can be performed in the same way as the first embodiment. That is, the radar apparatus 1 extracts a signal whose signal level exceeds a predetermined threshold in the FFT data after subtraction as a peak signal. In this case, the FFT data after subtraction subtracts only the peak signal corresponding to the oscillation of the power supply voltage. Therefore, erroneous detection of the peak signal caused by the oscillation of the output voltage of the power source 20 as a target can be avoided, and detection of the original target existing in the vicinity of the oscillation frequency also becomes possible.

Even in the case where there is no abnormality in the power output (No at the step S801), the radar apparatus 1 performs the peak extraction processing in the same manner (step S804). In this case, since there is no processing for subtracting the abnormality information, the radar apparatus 1 extracts the peak signal from the FFT data obtained from the beat signal.

Then, in FIG. 10 back again, the radar apparatus 1 performs derivation processing of target information based on the extracted peak signal (step S705). This processing can be performed in the same way as the step S205 described above.

In this way, in the third embodiment, when there is an abnormality in the power output, the radar apparatus 1 subtracts the abnormality information, and extracts the peak signal. That is, when the output voltage of the power source is oscillating, by subtracting only the data corresponding to the oscillation of the power supply voltage in the FFT data, it is possible to prevent the erroneous detection of the peak signal caused by the oscillation of the power supply voltage as a target and it is also possible to detect a target existing in the vicinity of the oscillation frequency.

4. Fourth Embodiment

Next, the fourth embodiment is explained. In the embodiments described above, the case where there is an abnormality in the power output is explained as an example. However, for example, in the case where a switching power supply is used as a power supply, even when there is no abnormality in the power output, noise due to switching is superimposed on a beat signal, and a peak signal caused by the switching noise may be erroneously detected as a target. Therefore, in the fourth embodiment, the configuration for preventing this is explained.

<4-1. Configuration>

A radar apparatus 1 of the fourth embodiment also has almost the same configuration as that of the radar apparatus 1 shown in FIG. 1. Therefore, the explanation about the configuration of the radar apparatus 1 of the fourth embodiment is omitted.

In addition, the configuration of an amplifying part 16 of the fourth embodiment is almost the same as that of the amplifying part 16 shown in FIG. 2. However, a power source 20 of the fourth embodiment is the so-called switching power supply whose ON/OFF is switched by switching. Although the power source 20 is driven at a predetermined switching frequency, as described later, the power source 20 changes the switching frequency under a prescribed condition. Therefore, the power source 20 has the configuration for changing a switching frequency (e.g. modulation circuit, etc.).

<4-2. Processing>

Figure 13:
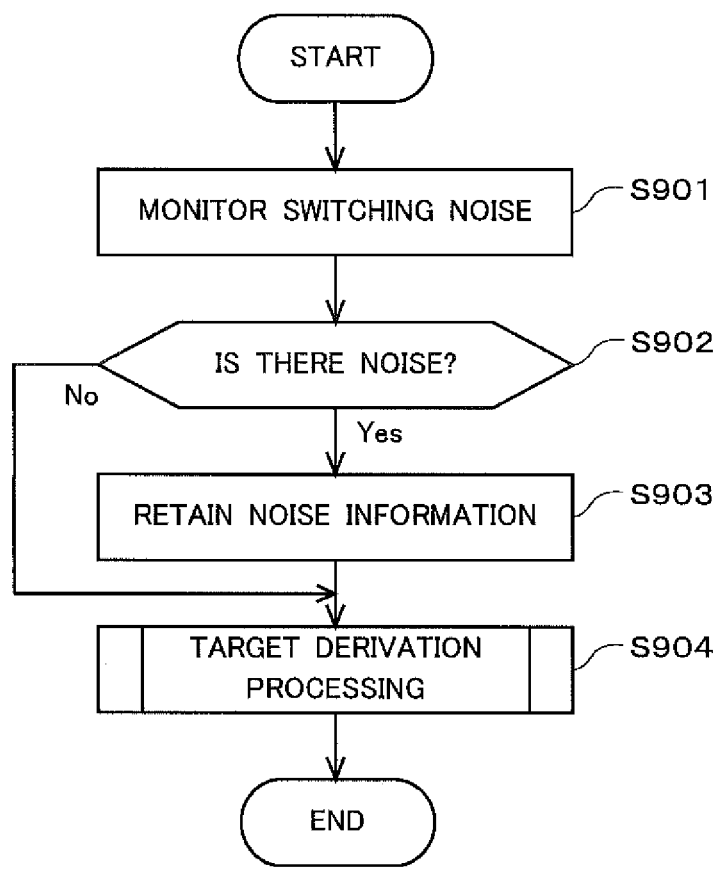
FIG. 13 is another flowchart that shows the processing of the radar apparatus.

Processing of the radar apparatus 1 of the fourth embodiment is explained. FIG. 13 is the flowchart that shows the processing of the radar apparatus 1 of the fourth embodiment.

When the radar apparatus 1 is powered on and started, the radar apparatus 1 monitors the presence or absence of a switching noise (step S901). Concretely, when detecting that its own apparatus is started, the radar apparatus 1 turns on a switch 167 of the amplifying part 16 under control by a signal processor 18 before starting target deviation processing. Then, the power source 20 is connected to an amplifier 165, and a voltage signal of the power source 20 is input into the amplifier 165 via a capacitor for HPF 161. The amplifier 165 amplifies the input voltage signal at a predetermined amplification factor. The amplified voltage signal is input into the signal processor 18 via an AD converter 17. Then, the signal processor 18 determines the presence or absence of a switching noise based on the input voltage signal.

Concretely, the signal processor 18 performs FFT processing to the input voltage signal and obtains FFT data. Then, the signal processor 18 determines the presence or absence of a switching noise based on the obtained FFT data. Since the switching frequency is predetermined, the signal processor 18 determines the presence or absence of a switching noise based on whether there is a peak signal in the vicinity of the predetermined frequency in the FFT data. When there is a peak signal, a switching noise exists, and when there is no peak signal, a switching noise does not exist. Also, the signal processor 18 may determine the presence or absence of a switching noise based on whether there is a peak signal in the vicinity of a harmonic of the predetermined frequency in the FFT data.

The method of determining on whether there is a switching noise of the power source 20 is not limited to this. Another method can be used if it is the method by which the presence or absence of a switching noise can be determined.

Then, when a switching noise exists (Yes at the step S902), the radar apparatus 1 retains noise information (step S903), and performs the target derivation processing (step S904). The noise information is the information such as a frequency where a switching noise exists and its signal level value. On the other hand, when a switching noise does not exist (No at the step S902), the radar apparatus 1 performs the target derivation processing (step S904).

Figure 14:
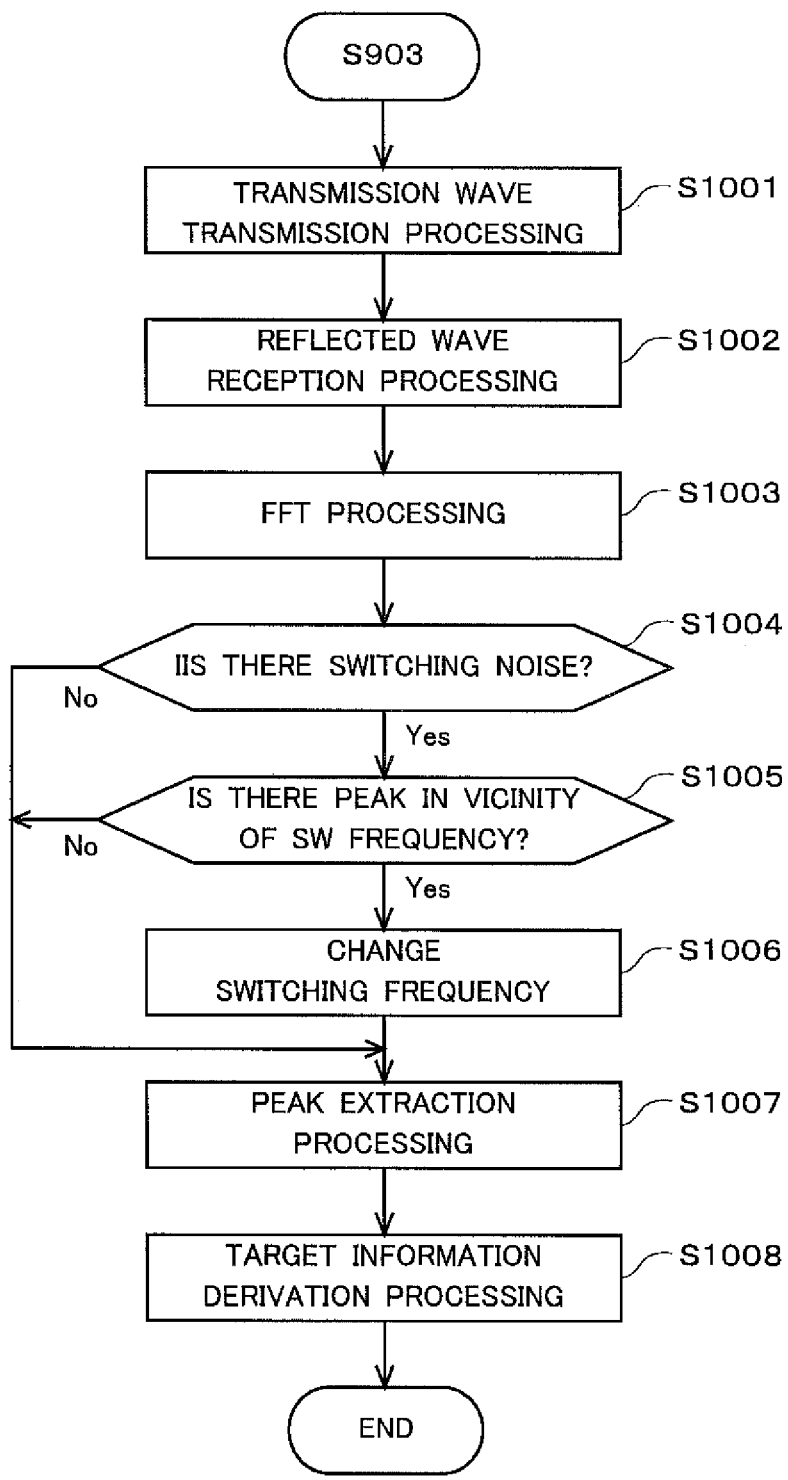
FIG. 14 is another flowchart that shows the target derivation processing.

Next, the target derivation processing of the fourth embodiment is explained using FIG. 14. FIG. 14 is the flowchart that shows the target derivation processing of the radar apparatus 1.

The radar apparatus 1 transmits a transmission wave from a transmission antenna 13 (step S1001), and receives a reflected wave arriving by reflection of the transmission wave on the target by a receiving antenna 14 (step S1002). Then, the radar apparatus 1 generates a beat signal that is a differential signal between the transmission signal corresponding to the transmission wave and the received signal corresponding to the reflected wave. The analog beat signal is amplified by the amplifying part 16, and the amplified beat signal is input into the signal processor 18 after it is converted into the digital signal by the AD converter 17.

Next, the radar apparatus 1 performs the FFT processing to the digital beat signal (step S1003). By performing this step, the radar apparatus 1 obtains the FFT data including a signal level value for each frequency for the beat signal. The FFT data is obtained for each of the receiving antennas 14*a*, 14*b*, 14*c*, and 14*d*.

Then, the radar apparatus 1 verifies whether there is a switching noise (step S1004). This means, in the processing for monitoring the presence or absence of a switching noise (step S902), the verification whether it is determined that there is a switching noise. The verification may be determined by a flag indicating the presence or absence of a switching noise, and may be determined based on the contents of the noise information. For example, if a flag is set to indicate the result of the presence or absence of a switching noise, the presence or absence of a switching noise can be determined by checking the flag. Also, it can be determined that there is a switching noise when the noise information is stored in a memory 182.

When there is no switching noise (No at the step S1004), the radar apparatus 1 performs peak extraction processing (step S1007). On the other hand, when there is a switching noise (Yes at the step S1004), the radar apparatus 1 determines whether there is a peak signal in the vicinity of the switching frequency (step S1005). Concretely, the radar apparatus 1 determines whether there is a peak signal other than the switching noise in the vicinity of the switching frequency of the FFT data which is obtained by performing the FFT processing to the beat signal.

When a switching noise is generated, the switching noise is also superimposed on the FFT data. Therefore, when a switching noise exists in the vicinity of the peak signal corresponding to the target, there is a possibility that the target is erroneously detected. Therefore, the radar apparatus 1 determines whether there is a peak signal other than the switching noise in the vicinity of the switching frequency.

Concretely, the radar apparatus 1 reads out the noise information stored in the memory 182, and searches for the FFT data of the switching frequency and its surrounding frequency included in the noise information. When a peak signal exists in the vicinity of the switching frequency of the FFT data, the radar apparatus 1 determines that there is a peak signal other than the switching noise.

In some cases, it is unclear whether the peak signal existing in the vicinity of the switching frequency is the peak signal corresponding to the target or the switching noise. In this case, a switching noise may be subtracted from the FFT data. If a peak signal exists in the FFT data after the switching noise is subtracted, it is determined that the peak signal is the peak signal corresponding to the target (That is, a peak signal other than a switching noise).

When determining that the peak signal other than the switching noise does not exist in the vicinity of the switching frequency (No at the step S1005), the radar apparatus 1 performs the peak extraction processing (step S1007).

On the other hand, when determining that the peak signal other than the switching noise exists in the vicinity of the switching frequency (Yes at the step S1005), the radar apparatus 1 changes the switching frequency (step S1006). Concretely, the signal processor 18 changes the switching frequency by controlling the modulation circuit or the like connected to the power source 20. This allows the switching noise existing in the vicinity of the peak signal corresponding to the target to move to another frequency.

The frequency to be changed is not especially limited, and it can be appropriately set. The frequency after change may be predetermined, or the radar apparatus 1 may change the switching frequency to the frequency where the peak signal corresponding to the target does not exist, by referring to the obtained FFT data.

Then, after changing the switching frequency, the radar apparatus 1 performs the peak extraction processing (step S1007). That is, the radar apparatus 1 extracts the peak signal used for deriving target information from the FFT data. Concretely, the radar apparatus 1 extracts a signal whose signal level exceeds a predetermined threshold in the FFT data as a peak signal.

Next, the radar apparatus 1 derives the target information based on the extracted peak signal (step S1008). The target information is, just like the embodiments described above, the direction (angle), distance, and relative velocity and the like of the target. The existing method can be used so as to derive each piece of the target information using the peak signal.

As above, in the fourth embodiment, even if a switching noise is superimposed on the FFT data and it appears in the vicinity of the peak signal corresponding to the target, the radar apparatus 1 can change the switching frequency. This allows the switching noise to separate from the peak signal corresponding to the target. As a result, erroneous detection of a target can be avoided.

5. Modification

The embodiments of the invention have been described so far. However, the invention is not limited to the embodiments described above, and may provide various modifications. Hereafter, these modifications are described. Hereafter, these modifications are described. All embodiments including the embodiments described above and the embodiments to be described below can be arbitrarily combined with others.

In the embodiments described above, when the radar apparatus 1 is started, the radar apparatus 1 monitors the presence or absence of an abnormality in the power output, or monitors the presence or absence of a switching noise. However, the monitoring may be performed at a predetermined timing while the radar apparatus 1 is driven.

Figure 15:
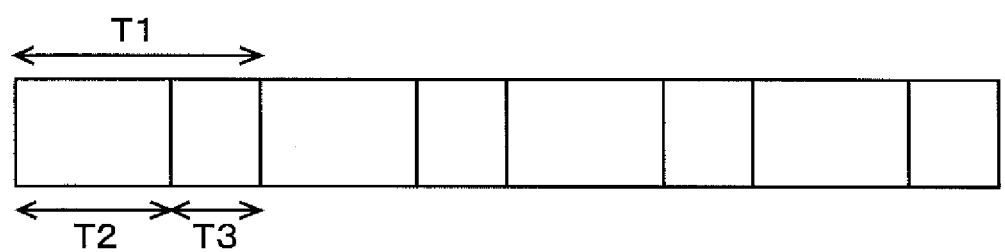
FIG. 15 shows a processing period of the radar apparatus.

FIG. 15 shows the outline of a processing period of the radar apparatus 1. As shown in FIG. 15, the radar apparatus 1 includes a period of transmitting/receiving a transmission wave and a received wave (T2) and a period of processing various signals (T3). A period covering these period T2 and period T3 (T1) is deemed as one cycle for the processing of the radar apparatus 1. That is, the radar apparatus 1 repeatedly performs the processing with the period T1 as one cycle.

The period T3 is the period when transmission waves and received waves are not transmitted/received, and a beat signal is not input into the amplifying part 16. Therefore, even while the radar apparatus 1 is driven, if the switch 167 is powered on and the power source 20 is connected within the period T3, it is possible to monitor the presence or absence of an abnormality in the power output or the presence or absence of a switching noise.

In the case of monitoring the presence or absence of an abnormality in the power output or the presence or absence of a switching noise while the radar apparatus 1 is driven, the monitoring may be performed for every period T3 of each cycle, or may be performed at a predetermined timing within the period T3. That is, the monitoring may be performed at any timing when it is necessary to monitor the presence or absence of an abnormality in the power output or the presence or absence of a switching noise.

As described above, even while the radar apparatus 1 is driven, by appropriately monitoring the presence or absence of an abnormality or the like, the radar apparatus 1 can respond to changes after it is started. Thus, it is possible to derive the target information with higher accuracy. Also, since the radar apparatus 1 monitors the presence or absence of an abnormality or the like by utilizing the period when a beat signal is not input into the amplifying part (That is, the period when the amplifying part is turned off under normal circumstances), it is not required to provide a monitoring configuration separately, and the amplifying part for signal processing can be shared. As a result, cost reduction and downsizing of the radar apparatus can be realized.

In the invention, when monitoring the presence or absence of an abnormality in the power output or the presence or absence of a switching noise, the fore part of the amplifying part (rear part of the mixer) may be brought into high impedance. Although the time of starting of a radar apparatus when they are monitored or the period T3 described above are the periods when a beat signal is not input into the amplifying part, it is possible to surely prevent erroneous input of a beat signal or another signal by bringing the fore part of the amplifying part into high impedance.

Figure 16:
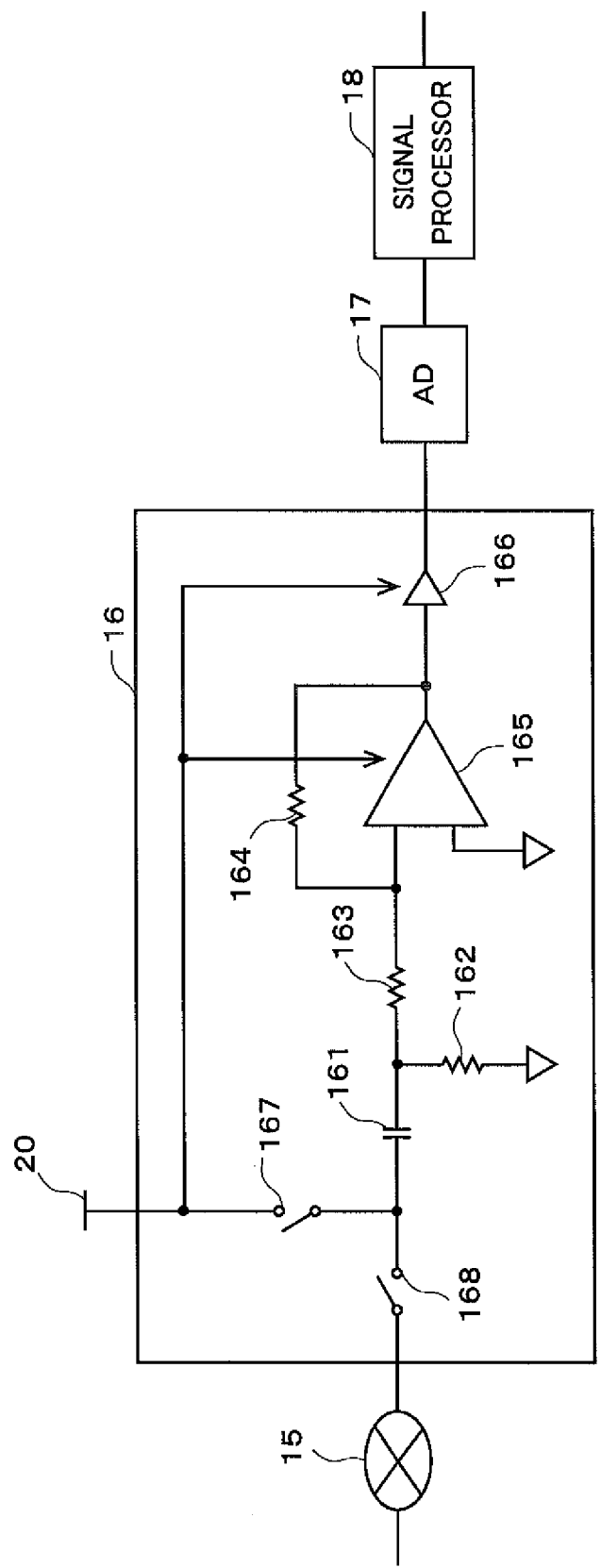
FIG. 16 shows another amplifying part.
Figure 17:
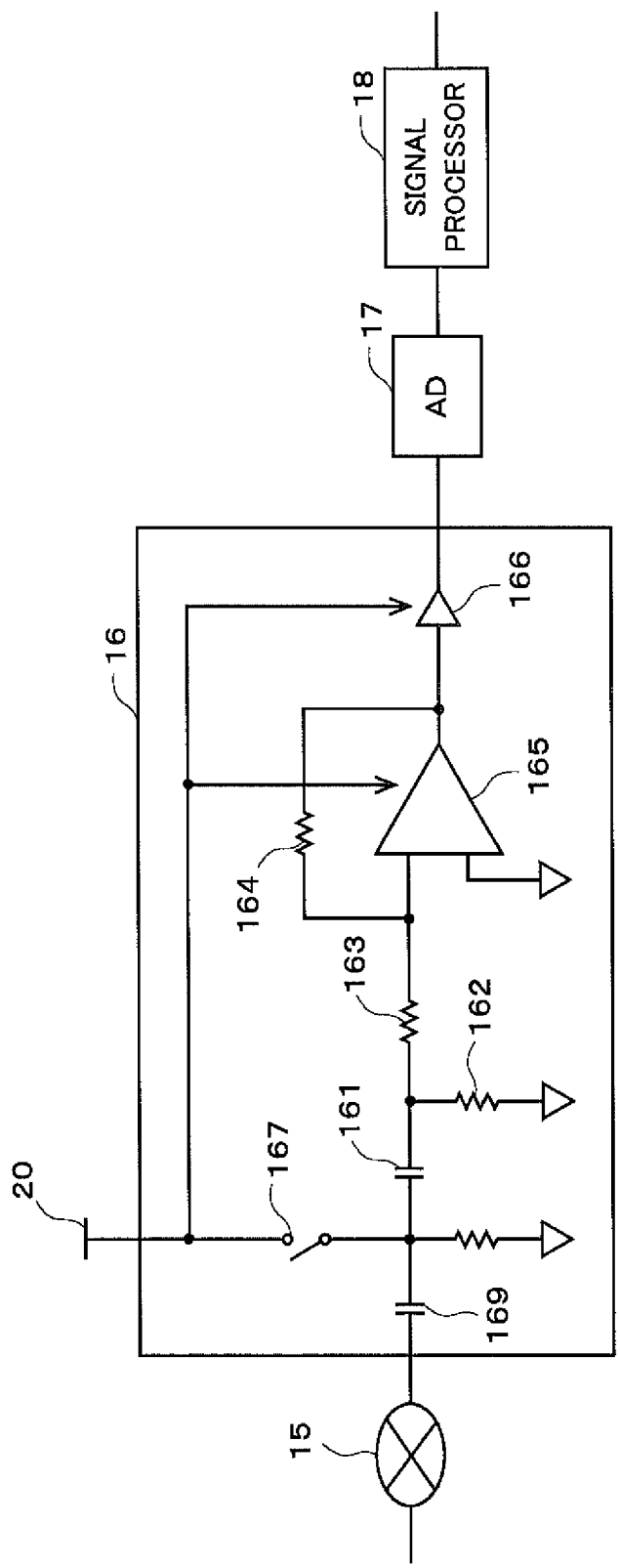
FIG. 17 shows another amplifying part.

In addition, as a configuration for preventing the erroneous input of a signal in this way, for example, there are configurations such as FIG. 16 and FIG. 17. A switch 168 is provided on the input side from the mixer 15 in the amplifying part 16, and the switch 168 is switched off when the presence or absence of an abnormality in the power output or the presence or absence of a switching noise is monitored (when the switch 167 is turned on). Also, a capacitor 169 or the like may be provided on the input side from the mixer 15 in the amplifying part 16.

Such a configuration can interrupt inputs from the mixer 15 side when the presence or absence of an abnormality in the power output or the presence or absence of a switching noise is monitored. Thus, the erroneous input of a beat signal or another signal can be prevented. In FIG. 16 and FIG. 17, the amplifying part 16 may include the newly-provided switch 168 and capacitor 169 or the like, and they may be externally connected to the amplifying part 16.

As described above, since the invention performs control considering an abnormality in the output voltage of the power source, it is possible to avoid erroneous control or the like caused by an abnormality, which allows control with higher accuracy. In addition, even when there is no abnormality in the output voltage of the power source, the invention can perform control considering a switching frequency. In this case, it is possible to avoid the erroneous control or the like caused by a switching noise, which allows more appropriate control.

In the embodiments described above, various functions are implemented by software, specifically by CPU arithmetic processing based on programs. However, some of these functions may be implemented by electrical hardware circuits. Contrarily, in the embodiments described above, some of the functions implemented by hardware circuits may be implemented by software.

While the invention has been shown and described in detail, the foregoing description is in all aspects illustrative and not restrictive. It is therefore understood that numerous other modifications and variations can be devised without departing from the scope of the invention.

What is claimed is:

1. A signal processor comprising:
   an amplifier that amplifies a control signal which is input into the amplifier to output an amplified control signal; and
   a controller that performs predetermined control based on the amplified control signal, wherein
   when the control signal is not input into the amplifier, the amplifier amplifies a voltage signal input from a power source for driving the amplifier.

2. The signal processor of claim 1, wherein
   the controller detects presence or absence of an abnormality in an output voltage of the power source based on the voltage signal amplified by the amplifier.

3. The signal processor of claim 2, wherein
   when detecting that there is the abnormality in the output voltage of the power source, the controller stops the predetermined control.

4. The signal processor of claim 2, wherein
   when detecting that there is the abnormality in the output voltage of the power source, the controller derives an exclusion signal excluding an abnormal frequency part from the control signal amplified by the amplifier, and performs the predetermined control based on the exclusion signal.

5. The signal processor of claim 2, wherein
   when detecting that there is the abnormality in the output voltage of the power source, the controller derives a subtraction signal subtracting a signal level value in an abnormal frequency from the control signal amplified by the amplifier, and performs the predetermined control based on the subtraction signal.

6. The signal processor of claim 1, further comprising:
a switch provided between the amplifier and the power source, and
wherein the switch is turned on when the control signal is not input into the amplifier.

7. The signal processor of claim 1, wherein
the controller detects presence or absence of a switching noise of the power source based on the voltage signal amplified by the amplifier.

8. The signal processor of claim 7, wherein
when detecting that there is the switching noise of the power source, the controller changes a switching frequency of the power source.

9. A radar apparatus that obtains information about a target, the radar apparatus comprising:
an amplifier that amplifies a differential signal between a transmission signal and a received signal to output an amplified differential signal;
a power source configured to drive the amplifier; and
a controller that derives the information about the target based on the amplified differential signal, wherein
the controller detects presence or absence of an abnormality in an output voltage of the power source based on a voltage signal of the power source, and derives the information about the target based on the amplified differential signal and the voltage signal of the power source when detecting that there is the abnormality in the output voltage of the power source.

10. A signal processing circuit that is used for a signal processor including a controller which performs predetermined control based on a control signal and which detects presence or absence of an abnormality in an output voltage of a power source based on a voltage signal output from the power source, the signal processing circuit comprising:
an input part into which the control signal or the voltage signal is input; and
an amplifier that amplifies the input control signal or the input voltage signal to output an amplified control signal or an amplified voltage signal, wherein
when the control signal is input into the amplifier, the amplifier amplifies the control signal and outputs the amplified control signal to the controller, and
when the control signal is not input into the amplifier, the amplifier amplifies the voltage signal input from the power source and outputs the amplified voltage signal to the controller.

11. A signal processing circuit that is used for a radar apparatus including a controller which derives target information based on a control signal and which detects presence or absence of an abnormality in an output voltage of a power source based on a voltage signal output from the power source, the signal processing circuit comprising:
an input part into which the control signal or the voltage signal is input; and
an amplifier that amplifies the input control signal or the input voltage signal to output an amplified control signal or an amplified voltage signal, wherein
when the control signal is input into the amplifier, the amplifier amplifies the control signal and outputs the amplified control signal to the controller, and
when the control signal is not input into the amplifier, the amplifier amplifies the voltage signal input from the power source and outputs the amplified voltage signal to the controller.

12. A radar apparatus comprising:
a controller that derives target information based on a control signal; and
a signal processing circuit that amplifies the control signal and outputs an amplified control signal to the controller when the control signal is input into the signal processing circuit, and that amplifies a voltage signal input from a power source as the control signal and outputs an amplified voltage signal to the controller when the control signal is not input into the signal processing circuit, wherein
in a case where the target information is derived when the amplified voltage signal output from the signal processing circuit is input as the control signal, the controller determines that there is an abnormality in an output voltage of the power source.

* * * * *